(12) United States Patent
Lin

(10) Patent No.: US 8,816,233 B2
(45) Date of Patent: Aug. 26, 2014

(54) CAPACITIVE TOUCH PANEL UNIT

(71) Applicant: Chih-Chung Lin, Taipei (TW)

(72) Inventor: Chih-Chung Lin, Taipei (TW)

(73) Assignee: Chih-Chung Lin, Taipei (TW)

( * ) Notice: Subject to any disclaimer, the term of this patent is extended or adjusted under 35 U.S.C. 154(b) by 0 days.

(21) Appl. No.: 13/759,062

(22) Filed: Feb. 5, 2013

(65) Prior Publication Data

US 2014/0008202 A1    Jan. 9, 2014

Related U.S. Application Data

(63) Continuation-in-part of application No. 13/542,820, filed on Jul. 6, 2012.

(51) Int. Cl.
*H03K 17/975* (2006.01)
*H03K 17/96* (2006.01)
*G06F 3/044* (2006.01)

(52) U.S. Cl.
CPC .............. *H03K 17/962* (2013.01); *G06F 3/044* (2013.01)
USPC ......................................................... 200/600

(58) Field of Classification Search
CPC .... H01H 13/702; H03K 17/962; G06F 3/045; G06F 3/044; H01L 24/33; H01L 21/4857
USPC .......................................................... 200/600
See application file for complete search history.

(56) References Cited

U.S. PATENT DOCUMENTS

| | | | |
|---|---|---|---|
| 8,629,364 B2 * | 1/2014 | Krier et al. ..................... | 200/600 |
| 2013/0153390 A1 * | 6/2013 | Lee et al. ....................... | 200/600 |
| 2013/0161177 A1 * | 6/2013 | Lee et al. ....................... | 200/512 |
| 2013/0199915 A1 * | 8/2013 | Guard ........................... | 200/600 |
| 2014/0008200 A1 * | 1/2014 | Lin ............................... | 200/600 |
| 2014/0008201 A1 * | 1/2014 | Lin ............................... | 200/600 |

* cited by examiner

*Primary Examiner* — R S Luebke
*Assistant Examiner* — Lheiren Mae Caroc

(57) ABSTRACT

A capacitive touch panel unit includes a transparent substrate, a conductive layer and a protection layer. The transparent substrate has a first side and a second side opposite to the first side. The conductive layer is disposed on the second side. The protection layer is correspondingly attached to one side of the conductive layer, which side is opposite to the transparent substrate. By means of the design of the capacitive touch panel unit, the number of the conductive layer is reduced to lower the manufacturing cost and reduce the total thickness.

5 Claims, 2 Drawing Sheets

CAPACITIVE TOUCH PANEL UNIT

This application is a Continuous-In-Part (CIP) Application of U.S. patent application Ser. No. 13/542,820, filed on Jul. 6, 2012.

BACKGROUND OF THE INVENTION

1. Field of the Invention

The present invention relates generally to a capacitive touch panel unit, and more particularly to a capacitive touch panel unit, which has greatly reduced thickness and is manufactured at lower cost.

2. Description of the Related Art

Along with the rapid development of information techniques and communication networks, various personal electronic information products have been more and more popularly used. To go with the tide, various touch panels have bee rapidly developed and applied to the electronic products. According to the sensing principle, the current touch panels can be mainly classified into resistive touch panels, capacitive touch panels, electromagnetic touch panels and optical touch panels. The capacitive touch panel structures have the advantages of dustproof, fireproof and high-resolution performances and are thus widely used. The working principle of the capacitive touch panel is that the touch point position is identified according to the change of capacitance. When a conductive touch article (such as a finger) gets close to the touch panel, the capacitance between the electrodes changes to identify the coordinates of the touch point.

The capacitive touch panels have gradually become the mainstream of touch techniques and are widely applied to various electronic information products nowadays, such as cellular phones, tablets, walkmans, handheld electronic devices, displays and monitors. The capacitive touch panel can detect the capacitance change caused by the weak current of human body to identify the positions of the finger and touch selection conditions so as to achieve the object of touch control.

Most of the conventional capacitive touch panels are double-board touch panels. The double-board touch panel is made of transparent conductive substrates by means of several times of halftone printing processes or lithography processes. The transparent conductive substrate are generally made of glass and coated with indium tin oxide (ITO) coatings. The unit price of the transparent conductive substrate is quite high. Moreover, in manufacturing, much material is wasted. In case that a defective product is produced in the manufacturing process, it is necessary to discard the entire touch panel without possibility of recovery. This results in waste of cost. Moreover, the touch panel is made of the transparent conductive substrates by means of several times of halftone printing processes or lithography processes. The transparent conductive substrates are respectively coated with the indium tin oxide (ITO) coatings. Such processes are complicated so that the manufacturing cost is greatly increased. Moreover, the double-board touch panel will increase the total thickness of the electronic device. This fails to meet the requirement for lightweight, slim and miniaturized structure of portable electronic device.

According to the above, the conventional touch panel has the following shortcomings:

1. The conventional touch panel has a larger thickness.
2. The manufacturing processes of the conventional touch panel are complicated.
3. The manufacturing cost of the conventional touch panel is higher.

SUMMARY OF THE INVENTION

It is therefore a primary object of the present invention to provide a capacitive touch panel unit, which can reduce the total thickness of the electronic device.

It is a further object of the present invention to provide the above capacitive touch panel unit the manufacturing cost of which is greatly lowered.

To achieve the above and other objects, the capacitive touch panel unit of the present invention includes a transparent substrate, a conductive layer and a protection layer.

The transparent substrate has a first side and a second side opposite to the first side. The conductive layer is coated on the second side. The protection layer is attached to one side of the conductive layer, which side is opposite to the transparent substrate. By means of the design of the capacitive touch panel unit, the number of the conductive layer is reduced to lower the manufacturing cost and reduce the total thickness of the electronic device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
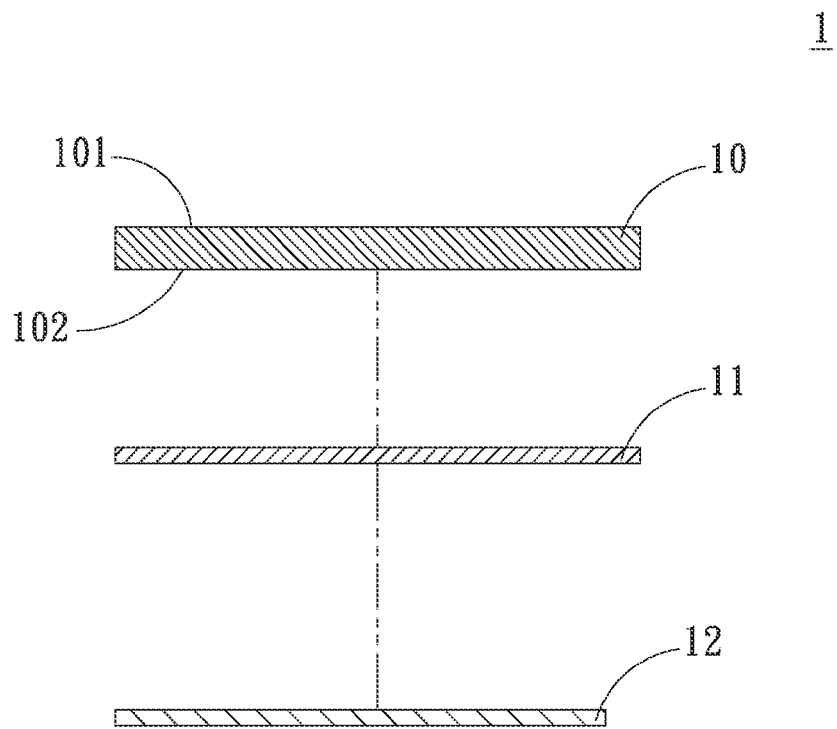
FIG. 1 is a sectional exploded view of a first embodiment of the capacitive touch panel unit of the present invention.
Figure 2:
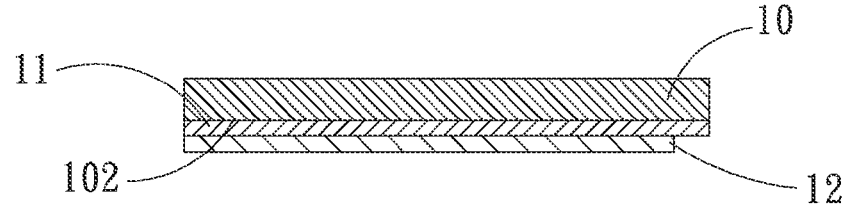
FIG. 2 is a sectional assembled view of the first embodiment of the capacitive touch panel unit of the present invention.

Please refer to FIGS. 1 and 2. FIG. 1 is a sectional exploded view of a preferred embodiment of the capacitive touch panel unit of the present invention. FIG. 2 is a sectional assembled view of the preferred embodiment of the capacitive touch panel unit of the present invention. According to the preferred embodiment, the capacitive touch panel unit 1 of the present invention includes a transparent substrate 10, a conductive layer 11 and a protection layer 12. In this embodiment, the material of the transparent substrate 10 is, but not limited to, glass for illustration purposes only. Alternatively, the material of the transparent substrate 10 can be selected from a group consisting of polyethylene terephthalate (PET), polycarbonate (PC), polyethylene (PE), polyvinyl chloride (PVC), polypropylene (PP), polystyrene (PS), polymethylmethacrylate (PMMA) and cyclo olefin copolymer (COC).

The transparent substrate 10 has a first side 101 and a second side 102 opposite to the first side 101. The conductive layer 11 is disposed on the second side 102. The conductive layer 11 is selected from a group consisting of indium tin oxide (ITO) coating, antimony tin oxide (ATO) coating and indium zinc oxide (IZO) coating. In this embodiment, the conductive layer 11 is disposed on the second side 102 by means of, but not limited to, sputtering deposition. In practice, the conductive layer 11 can be alternatively disposed on the second side 102 by means of gelatinization, electroplating or evaporation.

Please further refer to FIGS. 1 and 2. The protection layer 12 is correspondingly attached to one side of the conductive layer 11, which side is opposite to the transparent substrate 10. The material of the protection layer 12 is selected from a group consisting of silicon nitride (SiNx), silicon dioxide (SiO2) and silicon carbide (SiC). In this embodiment, the protection layer 12 is a coating coated on the side of the conductive layer 11, which side is opposite to the transparent substrate 10 by means of gelatinization, electroplating, evaporation, deposition or sputtering deposition for providing protection effect for the conductive layer 11.

Figure 3:
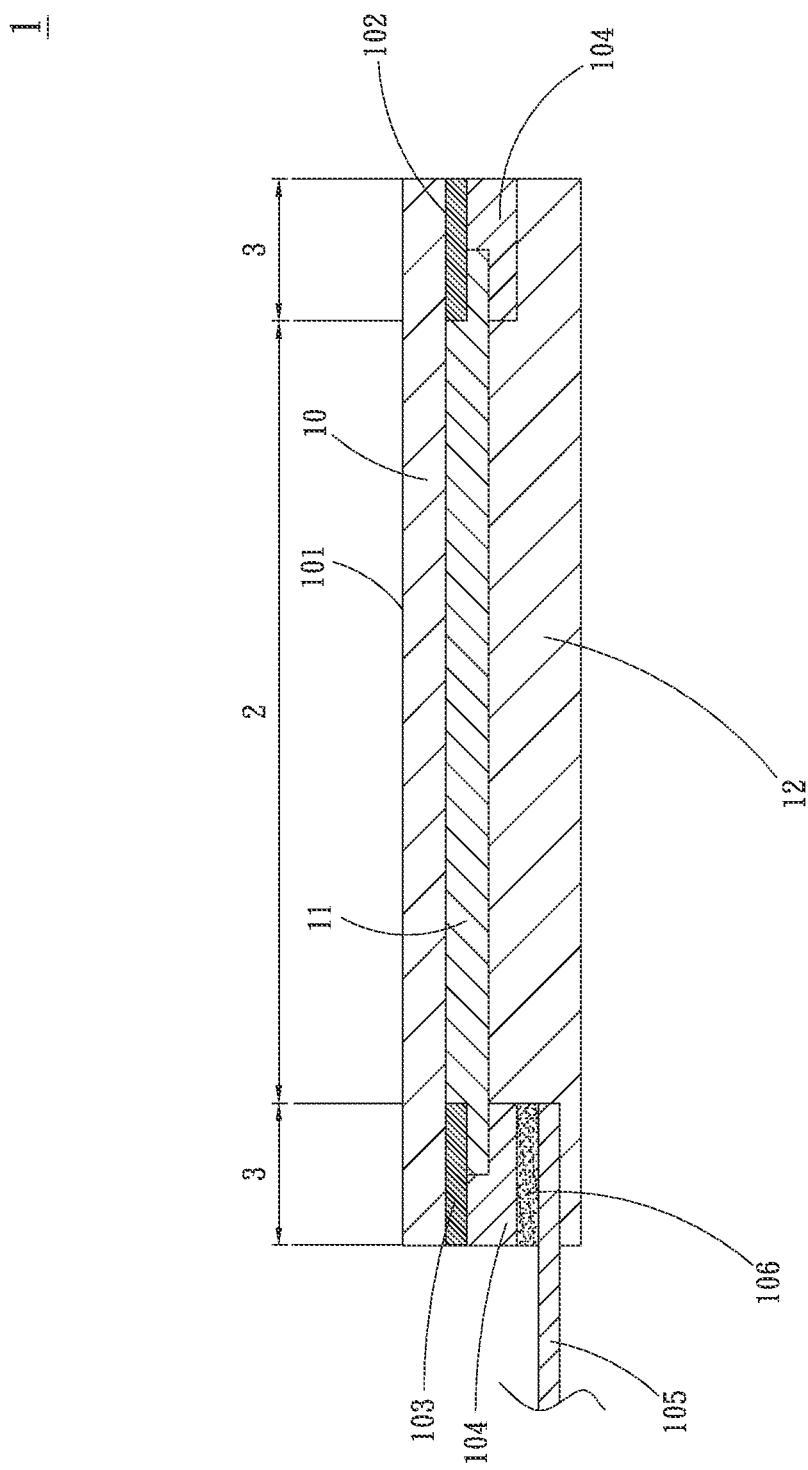
FIG. 3 is a sectional assembled view of a second embodiment of the capacitive touch panel unit of the present invention.

Please now refer to FIG. 3, which is a sectional assembled view of a second embodiment of the capacitive touch panel unit of the present invention. According to the second embodiment, the capacitive touch panel unit 1 of the present invention includes a transparent substrate 10, a shield layer 103, a conductive layer 11, a lead layer 104, a flexible circuit board 105 and a protection layer 12.

The transparent substrate 10 has a first side 101 and a second side 102. A central section of the transparent substrate 10 is defined with a touch section 2, while a peripheral section of the transparent substrate 10 is defined with a non-touch section 3. The material of the transparent substrate 10 is selected from a group consisting of glass, polyethylene terephthalate (PET), polycarbonate (PC), polyethylene (PE), polyvinyl chloride (PVC), polypropylene (PP), polystyrene (PS), polymethylmethacrylate (PMMA), and cycloolefin copolymer (COC). In this embodiment, the material of the transparent substrate 10 is, but not limited to, glass for illustration purposes only.

The shield layer 103 is disposed on the second side 102 of the transparent substrate 10 correspondingly on the non-touch section 3. A section of the transparent substrate 10 that is coated with the shield layer 103 is defined as the non-touch section 3. A section of the transparent substrate 10 that is free from the shield layer 103 is defined as the touch section 2. In this embodiment, the shield layer 103 is made of such as a nontransparent insulation material by means of printing or coating.

The conductive layer 11 is coated on the second side 102 of the transparent substrate 10 on the touch section 2. The conductive layer 11 partially extends from the touch section 2 to the other side of the shield layer 103, which side is distal from the transparent substrate 10. The conductive layer 11 is selected from a group consisting of indium tin oxide (ITO) coating, antimony tin oxide (ATO) coating and indium zinc oxide (IZO) coating. In this embodiment, the conductive layer 11 is disposed on the second side 102 by means of, but not limited to, sputtering deposition. In practice, the conductive layer 11 can be alternatively disposed on the second side 102 by means of gelatinization, electroplating or evaporation.

The lead layer 104 is disposed on one side of the shield layer 103 on the non-touch section 3, which side is distal from the second side 102. The lead layer 104 partially extends to the other side of the conductive layer 11, which side is distal from the shield layer 103. The lead layer 104 is electrically connected with the conductive layer 11. The lead layer 104 is formed of a metal material selected from a group consisting of silver paste, copper and molybdenum.

The flexible circuit board 105 is disposed on the non-touch section 3. A conductive adhesive 106 is disposed between the flexible circuit board 105 and the lead layer 104. The flexible circuit board 105 is attached to one side of the conductive adhesive 106, while the lead layer 104 is attached to the other side of the conductive adhesive 106. The flexible circuit board 105 is electrically connected with the lead layer 104 via the conductive adhesive 106. The conductive adhesive 106 is an anisotropic conductive film (ACF) or an anisotropic conductive paste (ACP).

The protection layer 12 is correspondingly attached to the other side of the conductive layer 11, which side is distal from the transparent substrate 10. The material of the protection layer 12 is selected from a group consisting of silicon nitride (SiNx), silicon dioxide (SiO2) and silicon carbide (SiC). In this embodiment, the protection layer 12 is a coating coated on the side of the conductive layer 11, which side is distal from the transparent substrate 10 by means of gelatinization, electroplating, evaporation, deposition or sputtering deposition for providing protection effect for the conductive layer 11. The protection layer 12 is also coated on the flexible circuit board 105 and the other side of the lead layer 104, which side is distal from the transparent substrate 10 to provide protection effect.

Therefore, the capacitive touch panel unit 1 of the present invention only includes one single conductive layer 11 to achieve the object of detection and touch control. In this case, the number of the conductive layer 11 is reduced to lower the manufacturing cost. Also, the total thickness of the electronic device is reduced.

According to the above arrangement, in comparison with the conventional touch panel, the present invention has the following advantages:

1. The total thickness is reduced.
2. The manufacturing process is simplified.
3. The manufacturing cost is lowered.

The present invention has been described with the above embodiments thereof and it is understood that many changes and modifications in the above embodiments can be carried out without departing from the scope and the spirit of the invention that is intended to be limited only by the appended claims.

What is claimed is:

1. A capacitive touch panel unit comprising:
   a transparent substrate having a first side and a second side, a central section of the transparent substrate being defined with a touch section, while a peripheral section of the transparent substrate being defined with a non-touch section;
   a shield layer disposed on the second side on the non-touch section;
   a conductive layer coated on the second side on the touch section and partially extending to the shield layer on the non-touch section;
   a lead layer disposed on one side of the shield layer, which side is distal from the second side and electrically connected with the conductive layer;
   a flexible circuit board disposed on the non-touch section, a conductive adhesive being disposed between the flexible circuit board and the lead layer, the flexible circuit board being electrically connected with the lead layer via the conductive adhesive; and
   a protection layer correspondingly attached to the other side of the conductive layer, which side is distal from the transparent substrate.

2. The capacitive touch panel unit as claimed in claim 1, wherein the protection layer is a coating coated on the side of the conductive layer by means of gelatinization, electroplating, evaporation, deposition or sputtering deposition, the material of the protection layer being selected from a group consisting of silicon nitride (SiNx), silicon dioxide (SiO2) and silicon carbide (SiC).

3. The capacitive touch panel unit as claimed in claim 1, wherein the conductive layer is a coating coated on the second side by means of gelatinization, electroplating, evaporation or sputtering deposition, the conductive layer being selected from a group consisting of indium tin oxide (ITO) coating, indium zinc oxide (IZO) coating and antimony tin oxide (ATO) coating.

4. The capacitive touch panel unit as claimed in claim 1, wherein the material of the transparent substrate is selected from a group consisting of glass, polyethylene terephthalate (PET), polycarbonate (PC), polyethylene (PE), polyvinyl chloride (PVC), polypropylene (PP), polystyrene (PS), polymethylmethacrylate (PMMA) and cyclo olefin copolymer (COC).

5. The capacitive touch panel unit as claimed in claim 1, wherein the protection layer is also coated on the flexible circuit board and the other side of the lead layer, which side is distal from the transparent substrate.

* * * * *